United States Patent [19]
Chang et al.

[11] Patent Number: 6,111,796
[45] Date of Patent: *Aug. 29, 2000

[54] PROGRAMMABLE DELAY CONTROL FOR SENSE AMPLIFIERS IN A MEMORY

[75] Inventors: Ray Chang; William R. Weier; Richard Y. Wong, all of Austin, Tex.

[73] Assignee: Motorola, Inc., Schaumburg, Ill.

[ * ] Notice: This patent is subject to a terminal disclaimer.

[21] Appl. No.: 09/259,454

[22] Filed: Mar. 1, 1999

[51] Int. Cl.[7] .................................................. G11C 7/08
[52] U.S. Cl. ................... 365/196; 365/194; 365/230.03; 365/225.7; 365/190; 365/207; 365/208
[58] Field of Search .................................. 365/196, 194, 365/230.03, 225.7, 190, 205, 206, 207, 208, 233, 227

[56] References Cited

U.S. PATENT DOCUMENTS

| 5,289,413 | 2/1994 | Tsuchida et al. | 365/189.02 |
|---|---|---|---|
| 5,321,661 | 6/1994 | Iwakiri et al. | 365/222 |
| 5,920,510 | 7/1999 | Yukutake et al. | 365/189.05 |
| 5,978,286 | 11/1999 | Chang et al. | 365/196 |
| 6,031,775 | 2/2000 | Chang et al. | 365/205 |

*Primary Examiner*—Andrew Q. Tran
*Attorney, Agent, or Firm*—James L. Clingan, Jr.; Susan C. Hill

[57] ABSTRACT

A memory has sense amplifiers that provide data onto a global data lines that are received by secondary amplifiers. The sense amplifiers and the secondary amplifiers are enabled by clocks that are timed by programmable delay circuits. The programmable delays are programmed by delay selection circuits that provide a continuous output to the programmable delay circuits. There are two delay selection circuits. One is shared by all of the programmable delay circuits that enable the sense amplifiers, and one is shared by all of the programmable delay circuits that enable the secondary amplifiers. The outputs of these two delay selection circuits are chosen to provide the output which programs the programmable delay circuits for optimizing the worst case of the access time of the memory.

18 Claims, 4 Drawing Sheets

PROGRAMMABLE DELAY CONTROL FOR SENSE AMPLIFIERS IN A MEMORY

FIELD OF THE INVENTION

The invention relates to controlling the delays in a memory, and more particularly to using programmable delays to control delays.

BACKGROUND OF THE INVENTION

One of the difficulties in designing a memory circuit is optimizing the timing of the clock signals that enable various functions in the memory circuit. Inherent in any clock signal is the propagation delay from the circuit that transmits the clock signal to the circuit that receives it. When a clock signal is generated, it is generally for enabling some function, and more specifically, for enabling some other circuit that plays a role in the function which is being enabled. The clock signal is provided for timing purposes in order to optimize a delay that is required. One thing that has been done to assist in this timing is to program that delay. One of the characteristics of that approach is that there must be some features, such as fuses, which are programmed in order to implement such programmed delay. Such fuses require space on the integrated circuit. Also, the clock signal that is generated can be optimized for one circuit that it is enabling, but because of the differences in delay based upon location of the receiving circuitry, another circuit may be clocked at a less than optimum point in time. Some level of optimization is provided, but using fuses to program a delay does not solve all of the problems associated with optimum control of the delay. The fuses, however, do take up space so each programmable delay element not only requires additional space for itself, but more than one delay must be included. Thus, there is more circuitry required than just one global delay circuit. In addition to that, there is the fusible links or other mechanisms required to perform that programming.

In memory design the advantages of dynamic amplifiers are well known. The advantage of a dynamic amplifier over a static amplifier is primarily power savings. The advantage of a static amplifier is that it will amplify whatever signal is there, whenever it is there, and does not latch the data. So as soon as the data arrives, it will begin amplifying and if the data has to reverse itself or that the initial data has noise on it, there is no risk that the output will provide wrong data because it will not latch in a wrong direction. It will reverse itself if it begins in the wrong direction and will ultimately provide the correct data. In a dynamic amplifier, the data is latched as soon as the amplifier is enabled. If wrong or inadequate data is there at that time, it could latch in the wrong direction. So to take advantage of the low power aspect of a dynamic amplifier, it is very important that the timing of its being enabled be optimized. There is a speed penalty if it is enabled later than necessary. There is a reliability problem if it is enabled too soon. With proper timing, the speed may also be faster for a dynamic amplifier than for a static amplifier.

In a memory there are typically many subarrays that divide up the memory for improved efficiency in power consumption and in speed of accessing the data. There are long lines that carry data to and from the inputs into the memory cell locations. There are also clock signals that may spread throughout the entire chip. The distance from the initiation of those clocks to the circuit that receives those can vary greatly in distance and thus there can be inconsistent delays from when one circuit receives the clock from another. This problem applies to dynamic amplifiers because they require a clock in order to be enabled. Also, dynamic amplifiers are going to be subject to processing, power supply voltage, and other secondary effects that will effect how such amplifiers are clocked. Such secondary effects may include noise generated by other aspects of the integrated circuit and such noise may vary based on location within the integrated circuit. These types of variations create a difficulty for implementing dynamic amplifiers in a memory. Thus there is a need for a system for optimizing clocks whereby the circuitry which is receiving the clocks is receiving the clock at its proper time.

DESCRIPTION OF THE FIGURES

Figure 1:
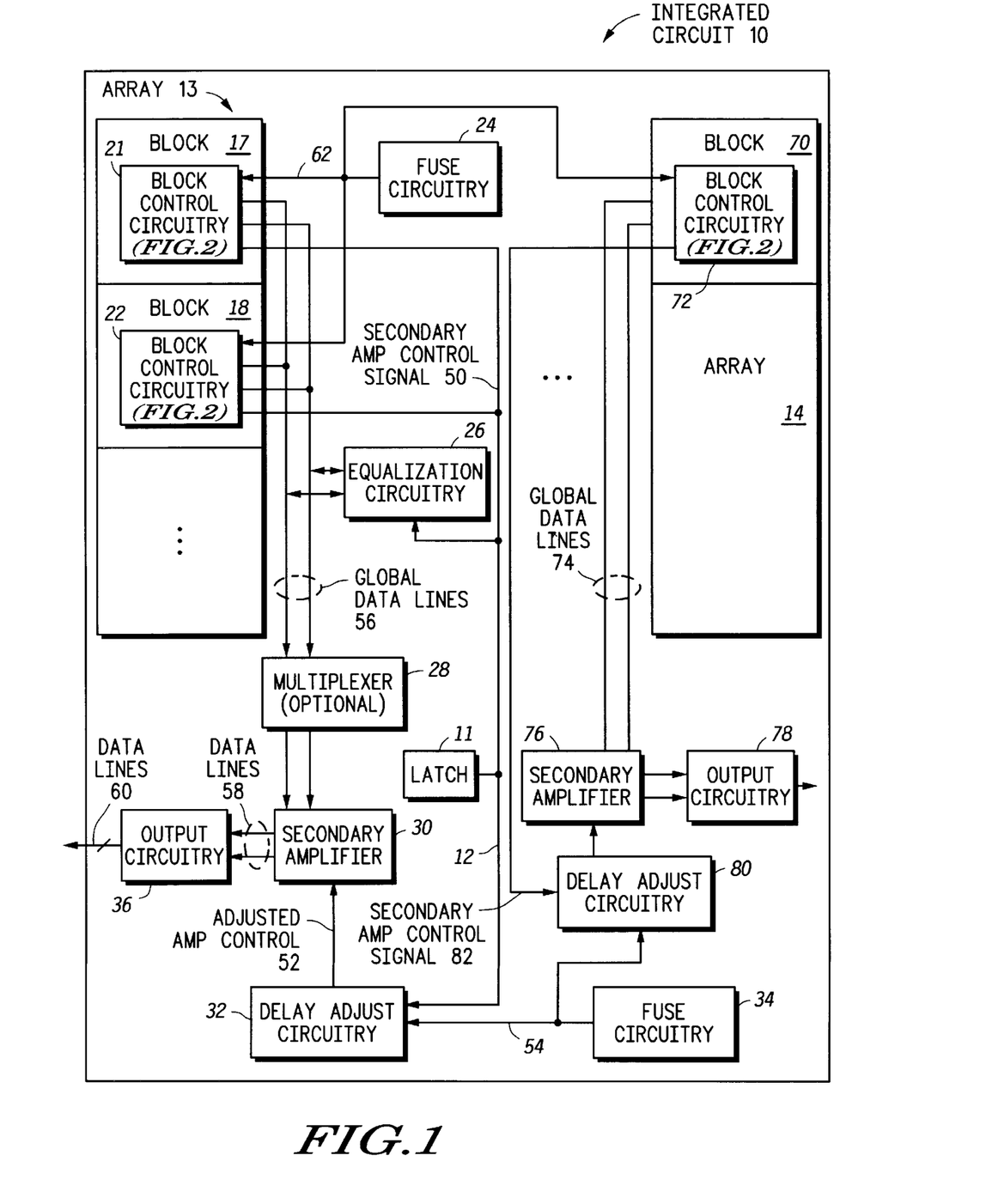
FIG. 1 is a block diagram of a memory according to an embodiment of the invention.

FIG. 1 illustrates one embodiment of integrated circuit 10. At least a portion of integrated circuit 10 includes memory circuitry. Arrays 13 and 14 are a part of this memory circuitry. Each array is partitioned into a plurality of blocks. For example, array 13 includes blocks 17 and 18. Each memory block includes block control circuitry. For example, memory block 17 includes block control circuitry 21 and memory block 18 includes block control circuitry 22. In one embodiment of the present invention the block control circuitry 21 and 22 are identical. In alternate embodiments of the present invention the block control circuitry within each memory block may be identical or may be slightly different. Fuse circuitry 24 has an output that provides a signal 62, which in this embodiment comprises 4 binary data bits, to block control circuitry 21 and 22. Block control circuitry 21 and 22 are coupled to global data lines 56 and provide an output to secondary amplifier 30 global data lines 56. Block control circuitry 21 and 22 are also coupled to line 12 and provide an output to delay adjust circuitry 32 via line 12. FIG. 1 further shows a block 70 within array 14, a block control circuit 72, a global data line 74, a secondary amplifier 76 that is analogous to secondary amplifier 30, output circuitry 78, and delay adjust circuitry 80. Block 70 includes a block control circuit 72, which is analogous to block control circuits 21 and 22. Block control circuitry 72 has a pair of outputs coupled to Global data line 74, an output that provides secondary amp control signal 82, and an input coupled to the output of fuse circuitry 24. Secondary amplifier 76 has a pair of signal inputs coupled to global data lines 74, an enable input, and a pair of outputs. Output circuit 78 has a pair of inputs coupled to the pair of outputs of secondary amplifier 76. Delay adjust circuit 80 has a clock input for receiving the secondary amp control signal 82, a program input coupled to the output of fuse circuitry 34, and an output coupled to the enable input of secondary amplifier 76.

Optional multiplexer 28 may be used to determine whether a block located in array 13 or array 14 is used to provide the data to secondary amplifier 30. Block control circuitry 21 and 22 are each capable of independently providing the secondary amp control signal 50 to delay adjust circuitry 32 and to equalization circuitry 26. Equalization circuitry 26 is coupled to global data lines 56. Fuse circuitry 34 provides one or more signals 54 to delay adjust circuitry 32. Delay adjust circuitry 32 provides an adjusted amp control signal 52 to secondary amplifier 30. Secondary amplifier 30 provides data lines 58 to output circuitry 36. Output circuitry 36 provides data lines 60 external to integrated circuits 10. A Latch 11 is coupled to the line that couples the block control circuits, such as block control circuitry 21 and 22, and latches secondary amp control signal 50. The output, secondary amp control signal 50, provided by block control circuitry, such as block control circuitry 21 and 22, is tri-stateable.

Figure 2:
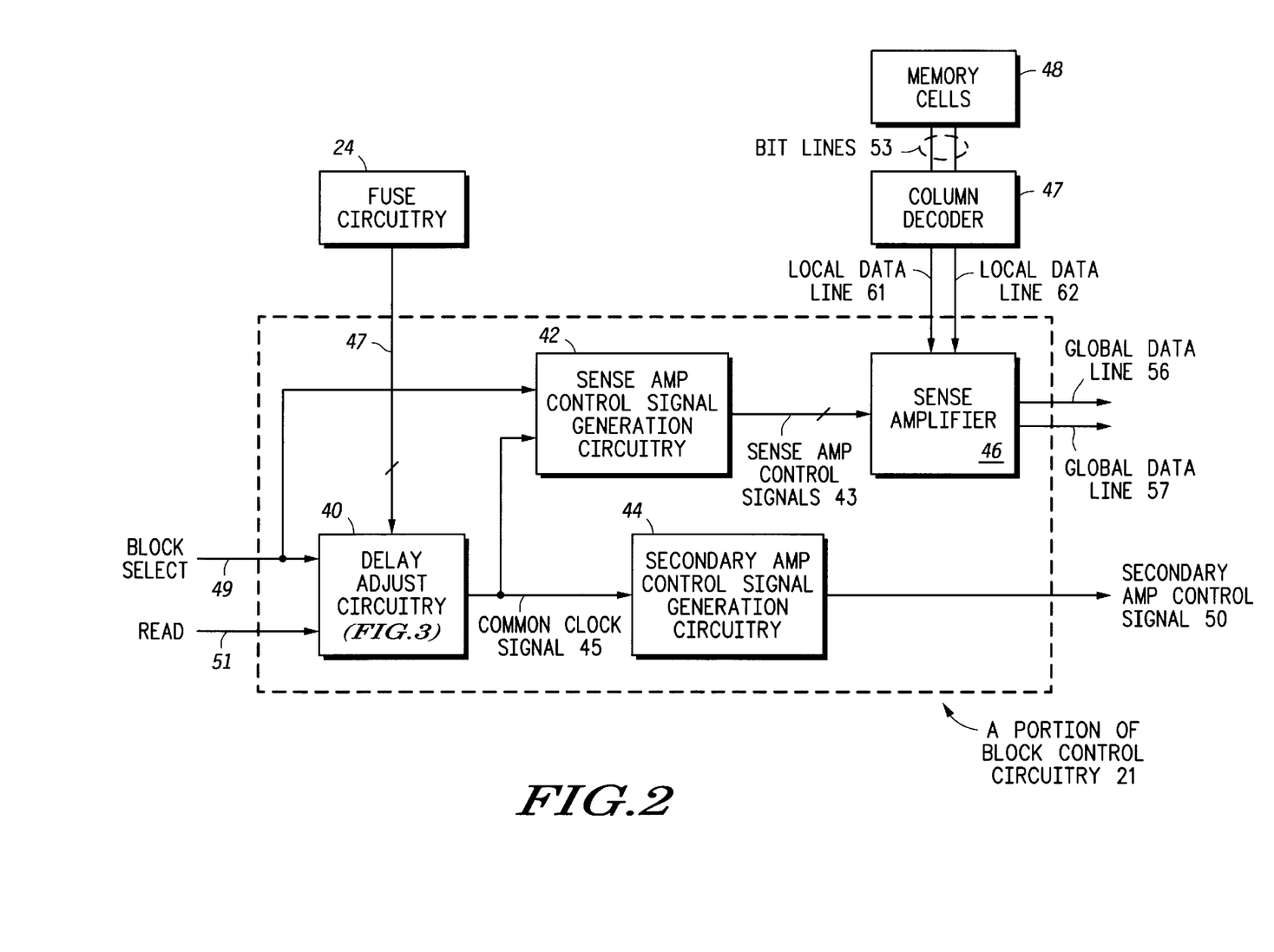
FIG. 2 is a block diagram of a selected portion of the memory of FIG. 1.

FIG. 2 illustrates a portion of block control circuitry 21 and fuse circuitry 24. Fuse circuitry 24 provides one or more signals 47 to delay adjust circuitry 40. Delay adjust circuitry 40 also receives block select signal 49 and read signal 51 as inputs. Block select signal 49 is also provided as an input to sense amp control signal generation circuitry 42. Delay adjust circuitry 40 provides signal 45 to sense amp control signal generation circuitry 42 and to secondary amp control signal generation circuitry 44. Sense amp control signal generation circuitry 42 provides sense amp control signals 43 to sense amplifier 46. Secondary amp control signal generation circuitry 44 provides secondary amp control signal 50. Sense amplifier 46 is coupled to local lines 61 and 62 that are coupled to column decoder 47. Column decoder 47 is coupled to memory cells 48 by way of bit lines 53. Sense amplifier 46 provides an output on global data lines 56 and 57.

Figure 3:
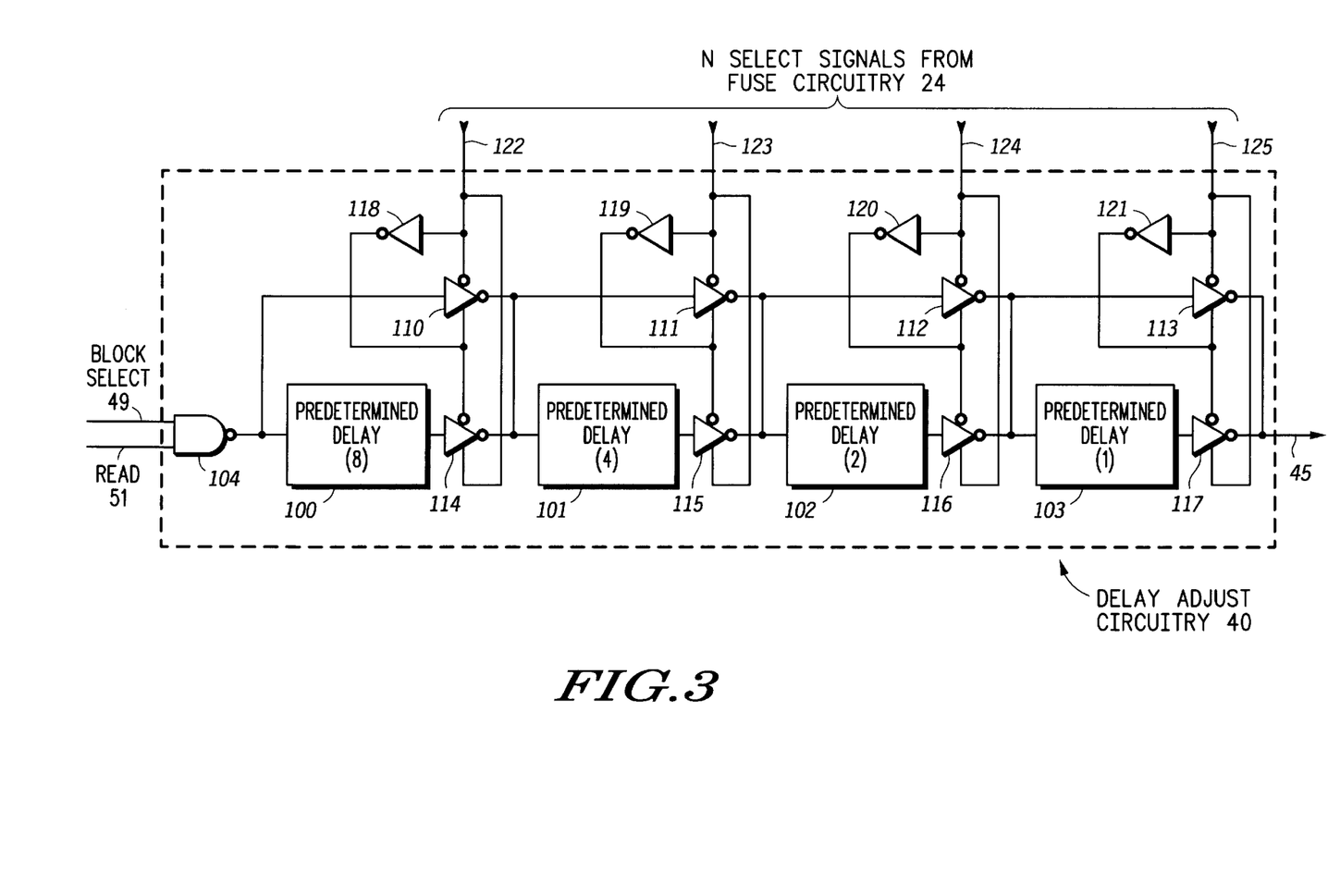
FIG. 3 is a logic diagram of a portion the selected portion shown in FIG. 2.

FIG. 3 illustrates one embodiment of delay adjust circuitry 40 of FIG. 2. Delay adjust circuitry 40 includes predetermined delay circuits 100–103, tri-stateable buffers 110–117, inverters 118–121, and NAND gate 104. NAND gate 104 receives block select signal 49 and read signal 51 as inputs. The output of NAND gate 104 is coupled to predetermined delay circuit 100 and the input of tri-stateable buffer 110. The output of predetermined delay circuitry 100 is coupled to the input of tri-stateable buffer 114. The output of tri-stateable buffer 114 is coupled to the input of predetermined delay circuit 101 and to the input of tri-stateable buffer 111. The output of predetermined delay circuit 101 is coupled to the input of tri-stateable buffer 115. The output of tri-stateable buffer 115 is coupled to predetermined delay circuit 102 and the input of tri-stateable buffer 112. The output of predetermined delay circuit 102 is coupled to the input of tri-stateable buffer 116. The output of tri-stateable buffer 116 is coupled to predetermined delay circuit 103 and to the input of tri-stateable buffer 113. The output of predetermined delay circuit 103 is coupled to the input of tri-stateable buffer 117. The output of tri-stateable buffer 117 is coupled to the output of tri-stateable buffer 113 and provides signal 45. The output of tri-stateable buffer 110 is coupled to the input of tri-stateable buffer 111. The output of tri-stateable buffer 111 is coupled to the input of tri-stateable buffer 112. The output of tri-stateable buffer 112 is coupled to the input of tri-stateable buffer 113.

Fused circuitry 24 provides N select signals 122–125 to delay adjust circuitry 40. Although the embodiment illustrated in FIG. 3 shows four select signals provided from fuse circuitry 24, alternate embodiments of the present invention may use any number of select signals. Selected signal 122 is coupled to the input of inverter 118, to the inverting control input of tri-stateable buffer 110, and to the non-inverting control input of tri-stateable buffer 114. Select signal 123 is coupled to the input of inverter 119, to the inverting control input of tri-stateable buffer 111, and to non-inverting control input of tri-stateable buffer 115. Select signal 124 is coupled to the input of inverter 120, to the inverting control input of tri-stateable buffer 112, and to the non-inverting control input of tri-stateable buffer 116. Select signal 125 is coupled to the input of inverter 121, to the inverting control input of tri-stateable buffer 113, and to the non-inverting control input of tri-stateable buffer 117. The output of inverter 118 is coupled to the non-inverting control input of tri-stateable buffer 110 and to the inverting control input of tri-stateable buffer 114. The output of inverter 119 is coupled to the non-inverting control input of tri-stateable buffer 111 and to the inverting control input of tri-stateable buffer 115. The output of inverter 120 is coupled to the non-inverting control input of tri-stateable buffer 112 and to the inverting control input of tri-stateable buffer 116. The output of inverter 121 is coupled to the non-inverting control input of tri-stateable buffer 113 and to the inverting control input of tri-stateable buffer 117.

Figure 4:
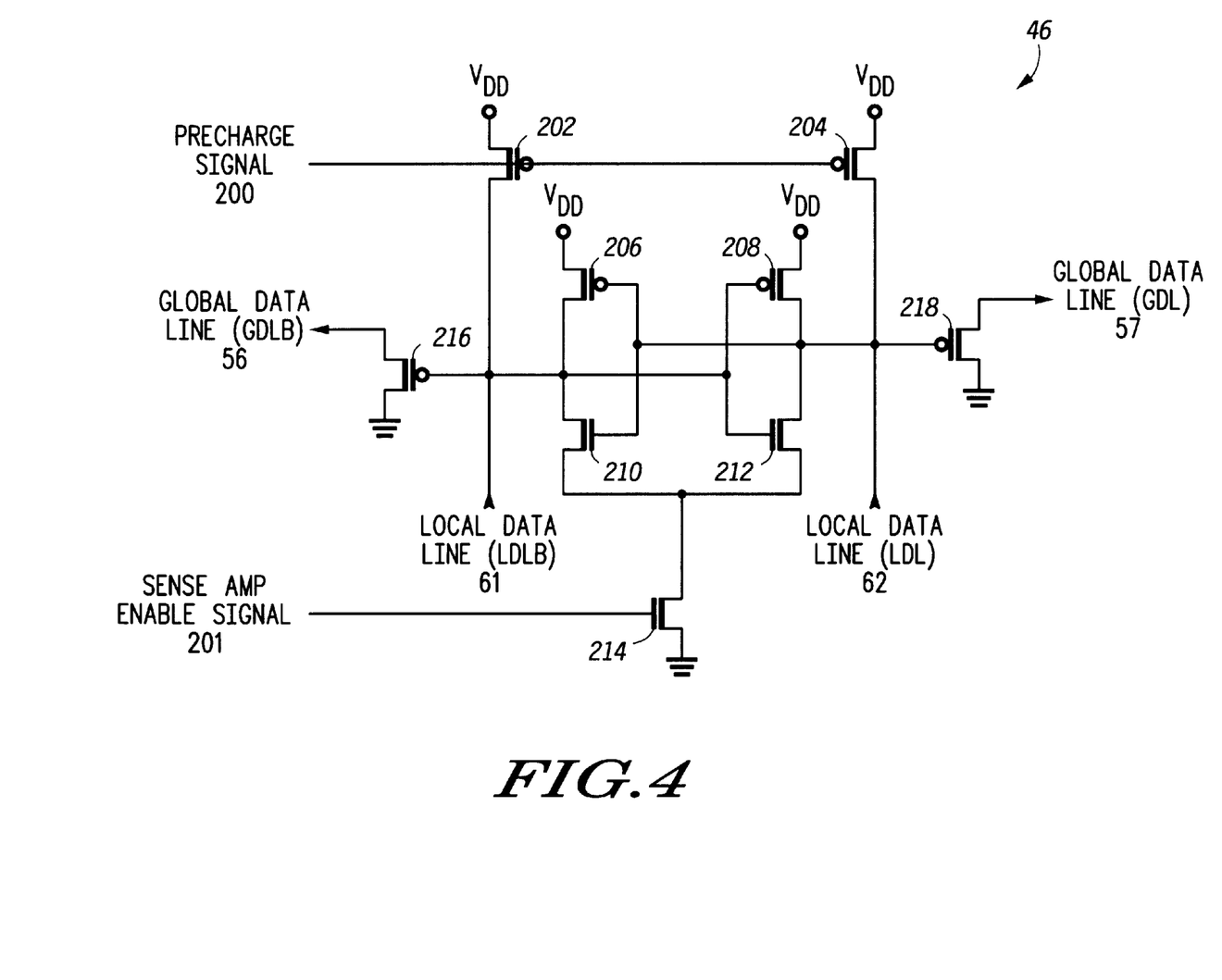
FIG. 4 is a circuit diagram of a sense amplifier according to an embodiment of the invention.

FIG. 4 demonstrates sense amplifier 46, shown in FIG. 2 in block diagram form, in more detail. Sense amplifier 46 comprises a P channel transistor 202, and P channel transistor 204, a P channel transistor 206, a P channel transistor 208, an N channel transistor 210, an N channel transistor 212, an N channel transistor 214, a P channel transistor 216, and a P channel transistor 218. Transistors 202 and 204 each have a gate for receiving precharge signal 200. Precharge signal 200 is one of the sense amp control signals 43 shown in FIG. 2. Transistors 202 and 204 each have a source coupled to a positive power supply terminal VDD for receiving a positive power supply. Transistor 202 has a drain coupled to local data line 61. Transistor 204 has a drain coupled to local data line 62. Transistor 206 has a source connected to VDD, a gate connected to local data line 62, a drain connected to local data line 61. Transistor 208 has a source connected to VDD, a gate connected to local data line 61, and a drain connected to local data line 62. Transistor 210 has a gate connected to local data line 62, a drain connected to local data line 61, and a source. Transistor 212 has a gate connected to local data line 61, a drain connected to local data line 62 and a source connected to the source of transistor 210. Transistor 214 has a gate for receiving sense amp enable signal 201 which is one of the sense amp control signals 43 shown in FIG. 2. Transistor 214 has a drain connected to the sources of 210 and 212 and a source connected to a negative power supply terminal shown in FIG. 4 as ground. Transistor 216 has a gate connected to local data line 61, a drain connected to ground, and a source connected to global data line 56. Transistor 218 has a gate connected to local data line 62, a drain connected to ground, and a source connected to global data line 57.

DESCRIPTION OF THE INVENTION

In operation, there are eight arrays analogous to arrays 13 and 14 and may conveniently be called octants. In any given access of the memory of integrated circuit 10, four octants will supply data in this described embodiment. There are 36 bits provided on each access so that each octant provides nine bits per access. Each octant has 32 blocks such as those of 17 and 18 shown in FIG. 1. For a given access only one block will provide data so that for a given access, a selected block will provide nine bits of data, one block per the four octants that are selected. Thus, arrays 13 and 14 can be considered subarrays of integrated circuit 10, and blocks 17 and 18 can be considered subarrays of array 13.

Prior to a read, equalization circuitry 26 equalizes global data lines 56. Multiplexer 28 is shown in FIG. 1 as being coupled to global data lines for the octant which has blocks 17 and 18. The global data lines that would be coming from a different octant, such as array 14, would also be coupled to multiplexer 28. Multiplexer 28 provides the data received from global data lines 56, or in the alternative, from the global data lines that are not shown to secondary amplifier 30. In the optional case, multiplexer 28 would not exist, global data lines 56 would be directly connected to secondary amplifier 30, and there would be an additional secondary amplifier for receiving the data from the not-shown global data lines from the other octant, such as array 14.

Output circuitry 36 receives data from secondary amplifier 30 and provides the desired output on data lines 60. Delay adjust circuitry 32 provides the timing for the enabling of secondary amplifier 30. The amount of delay is determined by the information provided on line 54 from fuse circuitry 34. Fuse circuitry 34 is selected alone during processing after integrated circuit 10 has been fully fabricated. Fuse blowing is common in the memory art. Memories typically have redundancy that is selectively implemented by fuse blowing. Further, it is now becoming common to identify individual integrated circuits based on lot number, location on the wafer, and other information. This information is also placed on the integrated circuit by fuse blowing. This information is encoded by fuse blowing. Thus, fuse blowing actually occurs in such a case on every device made. In the case of redundancy in a memory, it would be only in those cases where redundancy is required. The technology for implementing redundancy, however, is very reliable so the risk of using this technology is minimal even though it is put into effect on every device.

Fuse circuitry 24 similarly provides information to block control circuitry 21 and 22 as well as to other block control circuitry for other blocks not shown. This fuse circuitry is also selectively blown after electrical testing for optimum delay. Block control circuitry 21 and 22 implement the information provided on line 62 from fuse circuitry 24. Block control circuitry 21, for example, initiates sensing of information provided in block 17. That same circuitry, block control circuitry 21, which initiates sensing of the data, also provides secondary amp control signal 50 to delay adjust circuitry 32. The triggering of secondary amplifier 30 by delay adjust circuitry 32 is initiated by the secondary amp control signal 50 delayed by an amount chosen by fuse circuitry 34. Secondary amp control signal 50 is also used to terminate the equalization provided by equalization circuitry 26. Signal 50 is latched by latch 11 to hold the input to delay adjust circuitry in the logic state provided by block control circuitry 21 in this case. Line 12, which carries signal 50, is physically matched to global data lines 56. This is intentional and provides the benefit of providing excellent matching of the behavior, including delay, of signal 50 to that of the output provided onto global data lines 56. This function of delay selection performed by fuse circuitry 24 could also by another type of programmable circuit. For example this function could be performed by four bits of a non-volatile memory. This would be particularly applicable in the case where the delay being provided was for a SRAM memory that was on-board an MCU that also had some EEPROM. The selected delay could conveniently be loaded into the EEPROM instead of requiring the blowing of fuses. In such case the delay selection value would be user programmable during normal operation of the memory.

Shown in FIG. 2 is a portion of block control circuitry 21 and fuse circuitry 24. Also shown in FIG. 2 is a block of memory cells 48 representing the memory cells of block 17 and a column decoder 47 which selectively couples data from the memory cells to sense amplifier 46. So in operation, a row of memory cells in memory cells 48 is enabled and bit lines then develop data along that word line. Data is developed in bit line pairs. A selected one of these bit line pairs is then coupled to sense amplifier 46 by column decoder 47. This is standard operation for SRAMs. It is similar for DRAMs except the sense amplifier would be enabled prior to the column decoder being enabled. Sense amplifier 46 begins amplifying and latching the information from the selected bit line pair in response to sense amp control signals 43. In this particular embodiment, sense amplifier 46 receives the information from the bit lines via local data line 61 and local data line 62. Column decoder 47 selects from eight bit line pairs so that one of the eight bit lines pairs is coupled to sense amplifier 46 via local data line 61 and 62. Sense amplifier 46 is enabled by sense amplifier control signals 43 that come from sense amp control signal generation circuitry 42. Delay adjust circuitry 40 provides a common clock signal on line 45 which is a combination of block select and read signals. Block select signal 49 is also received by sense amp control signal generation circuitry 42 which uses it to release the precharge of sense amplifier 46 prior to enabling sense amplifier 46. Sense amplifier 46 is shown in more detail in FIG. 4. Precharge signal 200 is one of sense amp control signals 43.

In normal operation, the read signal will be active first followed by the block select signal. Delay adjust circuitry 40 then provides its output, the common clock signal, in response to the block select signal delay which is determined by fuse circuitry 24. Delay adjust circuitry 40 is a programmable delay which responds to selection signals provided by fuse circuitry 24. In this described embodiment, fuse circuitry 24 provides four binary bits of data to adjust the delay of delay adjust circuitry 40. Fuse circuitry 24 is shown as providing the data to delay adjust circuitry 40 via a line 47. Analogous delay adjust circuits for other blocks are also coupled to fuse circuitry 24 and receive these other four binary bits of data therefrom. Thus, each of these other programmable delays which reside within the block control circuits, such as delay adjust circuit 40 that is within block control circuits 21, are programmed to have the same delay.

Secondary amp control signal generation circuitry 44 also responds to the output, common clock signal 45, of delay adjust circuitry 40 and provides secondary amp control signal 50 that is used to enable secondary amplifier 30 via delay adjust circuitry 32 as shown in FIG. 1. Thus, both sense amplifier 46 and secondary amplifier 30 are enabled in response to the block select signal 49 via common clock signal 45. Because signal 45 is a locally generated control signal from block select 49, the clocking of sense amplifier 46, the generation of data on global data line 56, and the generation of signal 50, which is used to clock secondary amplifier 40, are closely matched. Secondary amp control signal generation circuitry 44, for the case when the block in which it is included is not selected, must provide a high impedance output so that analogous block control circuitry from the other selected block can then enable secondary amplifier 30 via delay adjust circuitry 32. Secondary amp control signal generation circuitry 44 has an output stage that includes a tri-state buffer. Latch 11 holds the sense amp control signal 50 when no block is active. Sense amplifier 46 provides data on global data line 56 and 57 which is received by secondary amplifier 30 either indirectly via mulitplexer 28 in one embodiment as shown in FIG. 1 or directly by secondary amplifier 30 in another.

Fuse circuitry 24 and 34 are blown according to electrical measurements made after processing integrated circuit 10 to a point where it can be electrically tested. Electrical tests are used to determine the optimum delay for delay adjust circuitry 40 and delay adjust circuitry 32. This is achieved by determining what is the minimum delay which will result in reliably detecting data from each memory cell. Thus fuse circuitry 24 and 34 are chosen so that even the slow bits will be reliable. If some bits are exceedingly slow, then they are effectively defective and are not considered in choosing the proper delay for the delay adjust circuits such as delay adjust circuitry 40 and 32. In those cases where the delay is excessive, those too-slow bits are considered defective and would be subject to being replaced by the redundancy that is available commonly on memories. After the delay adjust circuitry has been optimized by selecting fuse circuitry 24 and 34, redundancy has been implemented, if necessary, and the identification fuse blowing has occurred, then integrated circuit 10 is retested.

This arrangement of the delay adjust circuitry 40 being within a block allows for very accurate tracking of the other delays which occur in relation to the delay provided by delay adjust circuitry 40. As an alternative, delay adjust circuitry 40 can be shared by adjacent block select circuitry. For example, delay adjust circuitry 40 may be shared by block control circuitry 21 and 22. Fuse circuitry 24 is utilized for the fine adjustments that do not scale according to the process changes. For example, by having a delay adjust circuitry in close proximity to each block, the problems of long delays and inconsistent delays are reduced compared to what would occur if the delay adjust circuitry was in a single location on the chip. Sense amplifier 46, in order to be effective, must be fairly close to the bit lines or it would be extremely slow. The memory cells that provide the data onto the bit lines have very little drive capability. Thus with the sense amplifiers inside the blocks, such as sense amplifier 46 being within block 21, any centralized delay adjust circuit would have to traverse the distance from its location to each block. Thus, the distance traversed from the delay circuit to the blocks would vary depending upon which block was selected. Another example of the benefit of locally providing the delay circuit is being able to match power supply variations. Power supply voltage varies based on the location within the chip. With the delay circuit being close to the block, the delay circuit will receive a power supply voltage which is more likely to be closer to that received by that block than if it were located remotely from that block. Similarly, delay adjust circuitry 32 is located in close proximity to secondary amplifier 30 to enhance the matching between the two.

A power supply voltage can vary significantly based upon the location in the chip. The lines that carry the power supply voltages are finite in size, and the current moving through those will cause drops in voltage so that, depending upon the location, the voltage itself may vary. Thus, the fuse circuitry which is programmable by blowing the fuses which in turn provides information to the programmable adjust circuitry, such as delay adjust circuitry 40, is adjustable for those kinds of things that vary but are not necessarily completely matched by having the circuitry in close proximity. This may include power supply variation. For another example, the speed at which a sense amplifier will provide a usable output itself may vary based upon processing that it undergoes. That characteristic may not scale with the delays that occur in ordinary inverters and logic gates that are generating clock signals, or it may not scale one to one, if it does scale to some extent. Thus parameters that change but can not be matched, or at least completely matched, simply by close proximity of the clock circuitry, for example, are taken into account by fuse circuitry 24.

The slowest bit determines the speed of a memory. One never knows in actual usage which bits will be used and which will not. It must be assumed that they all will. Thus, the manufacturer specifies the speed of the device based on the slowest bit. The operator or the user of a device similarly can only operate the device at the clock speed that takes into account its slowest bit. In this case, the local circuitry ensures that the highest speed of operation is available for any given bit and the fuse circuitry ensures that even the slowest bit is taken into account so that the slowest bit will operate at its fastest capability.

Thus, the delays are provided for optimization of the sense amplifier and the secondary amplifier so that there is enough signal generated for reliable detection, but not a longer delay time than is necessary. This is achieved by having the clock delay circuitry be in close proximity to the circuits that are being clocked by those delays. A single fuse circuitry for programming these delays is effective because the worst case is the determining issue with respect to the speed of the device and the single fuse circuitry is sufficient for optimizing the speed of the slowest case. The fast bits are not operating at their fastest speed but that would not improve the utility of the device anyway. In this case the information concerning the delay is transmitted globally and continuously so that the delay circuitry has received the delay information well before any signal is received for being delayed. Thus, there is no delay associated with the transmission of the delay information. Thus the timing issues that are typically raised by having a single circuit provide information to other circuits in various locations do not present a problem for locating the fuse circuitry.

Sense amplifier 46 and secondary amplifier 30 are each of the type known as dynamic amplifiers. Sense amplifier 46 is clocked by sense amp control signal 43 so that it is not slower than necessary, but is long enough to ensure latching of reliable data. Similarly, secondary amplifier 30 is clocked with the same considerations in mind. In this case, secondary amplifier 30 could be turned on too early if, for example, the data being provided on global data line 56 by block 17 is not sufficiently developed at the time secondary amplifier 30 is enabled. Delay adjust circuitry 32 is located in close proximity to secondary amplifier 30, and the block control circuitry is in close proximity to block 17. Thus the delay on global data lines 56 from block 17 to secondary amplifier 30 is matched by the delay on line 12 from block control circuitry 21 to delay adjust circuitry 32. By this matching, the signal development delay is very consistent between delay adjust circuitry 32 receiving its input and secondary amplifier 30 receiving the data on global data lines 56. Also, both amp control signal 50 and sense amp control signal 43 are generated from a common signal, block select 49, which has the benefit of further matching the relationship of the data provided onto global data lines 56 and secondary amp control signal provided on line 12.

Fuse circuitry 34 is similarly optimized as fuse circuitry 24 is. Measurements are taken so that the worst case condition is known and fuse circuitry 34 provides that information to delay adjust circuitry 32 so that the delay of enabling secondary amplifier 30 is as long as necessary for reliable operation but is short as is possible for maximum speed operation. Fuse circuitry 34 is selected for worst case condition relative to the operation of secondary amplifier 30, but each octant may have its own secondary amplifier. Fuse circuitry 34 selects the delay for each secondary amplifier. The operation of the chip though can operate no faster than the slowest operation of secondary amplifier, such as secondary amplifier 30 so that there is no speed penalty by having a single set of fuse circuitry for each secondary amplifier because fuse circuitry 34 does optimize the slowest case. With the improved timing of the enabling of sense amplifier 46 and secondary amplifier 30, the power savings advantage of dynamic amplifiers can be implemented while also providing high speed of operation.

Shown in FIG. 3 is a delay circuitry for use as delay adjust circuitry 40. In this circuit there are four different delays and they are in increments that are ratioed to each other. In this case, assume that predetermined delay 103 is the reference delay and is shown in FIG. 3, parenthetically, with a delay of (1). Predetermined delay 102 has a delay which is double (2) that of predetermined delay 103, predetermined delay 101 has four times (4) the delay of predetermined delay 103, and predetermined delay 100 has eight times (8) that delay. Because there are four binary bits coming in, these four delays are selected according to these four bits and are arranged so that any amount of delay from zero to 15 can be selected which takes into account all 16 options available from the four binary bits.

The operation is that any of predetermined delays 100, 101, 102, and 103 can be bypassed or used in any combination. The delays 100, 101, 102, and 103 correspond to binary signals 122, 123, 124, and 125, respectively. When a particular binary signal is a logic high, the corresponding delay is enabled. For example, a delay of ten can be achieved by applying binary signals 122 and 124 in a logic high state and binary signals 123 and 125 in a logic state. This has the effect of passing through predetermined delay 100 and predetermined delay 102 while predetermined delay 101 and predetermined delay 103 are bypassed. By being powers of two and using tri-stateable drivers between the delays, the delays give all the options, linearly, from 0 to 15. This is also compact because it integrates the decoding circuitry into the delay path such that it results in a relatively small area. This type of programmable delay is beneficial in these ways but is not necessary. Other types of programmable delays known in the art may be substituted for delay adjust circuitry 40.

Other options are available for choosing the ratios of the delays than the binary one, two, four, eight approach. There may be situations where nonlinear delays are used based on the bit selection. There may be a situation where the choice is either a significant amount of delay or nearly no delay, but in both cases there is a need for fine adjustment. In such a case, predetermined delay 100 could be chosen to be a relatively large number that would be an estimate of the delay for the case where the large delay is desired. The other delays would remain in the same one, two, and four relationship to cover the fine resolution for either the large delay or near-zero delay case. In any event, there may be other combinations of delay that would be more useful and that could be selected by binary inputs on 122, 123, 124, and 125.

FIG. 4 shows sense amplifier 46 receives a precharge signal which, in a logic low state, enables transistors 202 and 204 to precharge local data lines 61 and 62 to the voltage present on VDD. Local data line 61 (LDLB, local data line bar) is shown as the complementary data line. Local data line 62 (LDL) is the true data line. Precharge signal 200 is active at a logic low because that is the state in which it causes local data lines 61 and 62 to be precharged to a logic high. At the same time that precharge signal 200 precharges local data lines 61 and 62, equalization circuitry 26 equalizes global data lines 56 and 57 at VDD. With local data lines 61 and 62 at a logic high, transistors 216 and 218 are disabled. Upon initiation of a read, precharge signal 200 is disabled so that local data lines 61 and 62 are held at the logic high state by the capacitance associated with those lines and transistor nodes coupled thereto. As the read process begins, bit lines begin developing data and a column decoder, such as column decoder 47, couples a selected bit line pair to local data lines 61 and 62. After the signal is sufficiently developed on local data line 61 and 62, sense amp enable signal 201 is enabled so that transistor 214 becomes conductive. This has the effect of enabling sense amplifier 46 by enabling transistor 206, 208, 210 and 212 to begin amplifying and latch the data provided on local data lines 61 and 62. Assuming in this example that local data line 61 and 62 receives information represented by a logic low state and a logic high state, respectively. In such case, transistor 218 remains non-conductive and transistor 216 becomes conductive. While transistor 216 is conductive, the voltage on global data line 56 is being reduced due to current flow through transistor 216 to ground. The voltage on global data line 56 will continue dropping until transistor 216 becomes non-conductive. This will occur after global data line drops enough so that the threshold voltage of transistor 216 is no longer exceeded. The threshold voltage of transistor 216 is effected by body effect due to the source of transistor 216. Thus, the difference in voltage between global data line 56 and local data line 61 is the magnitude of the normal threshold voltage of a P channel transistor plus the amount added due to body effect.

Global data line 57 would remain unchanged. Thus a voltage differential would be established between global data line 56 and global data line 57, but that voltage would be limited to the difference between VDD and the threshold voltage of transistor 16 plus body effect. The advantage of this type of amplifier is that the differential is kept relatively small but sufficient for quick detection by secondary amplifier 30. With global data line 56 and 57 being relatively long and thus large in capacitance, this small voltage differential helps in preparation for the next read that may occur by taking less time to precharge. Because secondary amplifier 30 is a dynamic amplifier, it can sense this relatively small differential and latch the data provided from global data lines 56. The primary advantage, however, is to save current because these accesses are occurring, in this case, perhaps at 3 nanoseconds apart so this amount of charge that flows into the large capacitance of global data lines 56 and 57 becomes significant.

The sense amp enable signal 201 is the critical timing signal for optimizing the operation of sense amplifier 46. This is the signal that is precisely delayed by delay adjust circuitry 40 and programmed by delay selection signal 47 provided by fuse circuitry 24. Signal 47, which globally provides the delay information to the delay adjust circuits such as delay adjust circuitry 40, locally delays the precise enabling of common clock signal 45 in response to block select signal 49. In turn, precisely generated common clock signal 45 precisely generates sense amp enable signal 201. Common signal 45 also generates secondary amp signal 50 so that the development of data on global data lines 56 is matched with the development of secondary amp signal 50 on line 12.

What is claimed is:

1. A memory comprising:
   a plurality of arrays including a first array and a second array, the first array including a plurality of blocks;
   a first global data line associated with the first array;
   a first delay selection circuitry for providing a delay selection value;
   wherein each of the plurality of blocks comprises:
      a plurality of memory cells;
      a primary sense amplifier having a first input coupled to the plurality of memory cells, a second input that receives a primary sense amp enable signal, and an output coupled to the first global data line;

a first delay adjust circuit that receives the delay selection value and a control signal, and generates a delayed control signal by delaying the control signal by an amount determined by the delay selection value; and a first control signal generation circuit which receives the delayed control signal and which provides the primary sense amplifier enable signal to the second input of the primary sense amplifier.

2. A memory as in claim 1, wherein the first delay selection circuit provides the delay selection value to each first delay adjust circuitry within each of the plurality of blocks.

3. A memory as in claim 1, wherein the first delay selection circuitry provides the delay selection value to each of the plurality of blocks within each of the plurality of arrays in the memory.

4. A memory as in claim 1, wherein the delay selection value is selected during an electrical probe of the memory.

5. A memory as in claim 1, wherein the delay selection value is user programmable during normal operation of the memory.

6. A memory as in claim 1, wherein the delay selection value is linearly related to the amount of delay between the control signal and the delayed control signal.

7. A memory as in claim 1, wherein the delay selection value is a function of a propagation delay from the plurality of memory cells to the primary sense amplifier.

8. A memory as in claim 1, wherein the control signal includes a block select signal.

9. A memory as in claim 8, wherein the control signal includes a read signal.

10. A memory comprising:

a plurality of arrays comprised of blocks of memory cells;

a plurality of sense amplifiers located within the blocks of memory cells for detecting the logic states of the memory cells and having outputs for providing signals representative of the logic states of the memory cells in response to being enabled;

global data lines coupled to the outputs of the sense amplifiers;

a first delay selection circuit having an output for providing a delay selection value; and programmable delay circuits which enable the sense amplifiers, each delay circuit having a program input coupled to the output of the first delay selection circuit.

11. The memory of claim 10, wherein the first delay selection circuit comprises a plurality of fuses coupled together to provide the delay selection value, the delay selected by blowing selected fuses of the plurality of fuses.

12. The integrated circuit of claim 10 wherein the first delay selection circuit is a non-volatile memory.

13. A memory comprising:

a plurality of arrays comprised of blocks of memory cells;

a sense amplifier within a first block of the blocks of memory cells which detects a logic state of a selected memory cell in the first block and outputs a data signal on a data line in response to being enabled;

a secondary amplifier, coupled to the data line, which responds to the data signal in response to being enabled;

a first programmable delay circuit which enables the sense amplifier;

a second programmable delay circuit which enables the secondary amplifier.

14. A memory comprising: a plurality of arrays comprised of blocks of memory cells;

a sense amplifier located within a first block of the blocks of memory cells, coupled to a data line, and having an enable input;

a secondary amplifier coupled to the data line;

a first delay selection circuit having an output; and a first programmable delay circuit having a program input coupled to the output of the first delay selection circuit and an output coupled to the enable input of the sense amplifier.

15. The memory of claim 14, wherein the secondary amplifier is further characterized as having an enable input, further comprising:

a second delay selection circuit having an output; and a second programmable delay circuit having a program input coupled to the output of the second delay circuit and an output coupled to the enable input of the secondary amplifier.

16. A memory comprising:

a plurality of arrays including a first array and a second array;

a first global data line associated with the first array;

a second global data line associated with the second array;

a first sense amplifier having a sense input coupled to the first array and an output coupled to the first global data line;

a second sense amplifier having a sense input coupled to the second array and an output coupled to the second global data line;

a first secondary amplifier having a sense input coupled to the first global data line, an enable input, and an output;

a second secondary amplifier having a sense input coupled to the second global data line, an enable input, and an output;

a delay selection circuit which has an output;

a first programmable delay circuit which has a program input coupled to the output of the delay selection circuit and an output coupled to the enable input of the first secondary amplifier; and a second programmable delay circuit which has a program input coupled to the output of the delay selection circuit and an output coupled to the enable input of the second secondary amplifier.

17. The memory of claim 16, wherein the delay selection circuit is a plurality of fuses.

18. The memory of claim 16, wherein the delay selection circuit is a non-volatile memory.

* * * * *